(12) United States Patent
Kim et al.

(10) Patent No.: US 11,343,905 B2
(45) Date of Patent: May 24, 2022

(54) ASYMMETRIC DIFFERENTIAL VIA STUBS FOR SKEW COMPENSATION

(71) Applicant: HEWLETT PACKARD ENTERPRISE DEVELOPMENT LP, Houston, TX (US)

(72) Inventors: Hyunjun Kim, Renton, WA (US); Andrew J. Becker, Eau Claire, WI (US); Paul T. Wildes, Eau Claire, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 27 days.

(21) Appl. No.: 16/805,517

(22) Filed: Feb. 28, 2020

(65) Prior Publication Data

US 2021/0274648 A1   Sep. 2, 2021

(51) Int. Cl.
| | | |
|---|---|---|
| *H05K 1/02* | (2006.01) | |
| *H01P 3/08* | (2006.01) | |
| *H05K 3/46* | (2006.01) | |
| *H05K 3/00* | (2006.01) | |
| *H05K 3/42* | (2006.01) | |
| *H01P 11/00* | (2006.01) | |

(52) U.S. Cl.
CPC ............. *H05K 1/0248* (2013.01); *H01P 3/08* (2013.01); *H01P 11/003* (2013.01); *H05K 1/0245* (2013.01); *H05K 3/0047* (2013.01); *H05K 3/429* (2013.01); *H05K 3/4644* (2013.01)

(58) Field of Classification Search
CPC .. H05K 1/0248; H05K 1/0245; H05K 3/0047; H05K 3/429; H05K 3/4644; H01P 3/08; H01P 11/003
See application file for complete search history.

(56) References Cited

U.S. PATENT DOCUMENTS

| | | | |
|---|---|---|---|
| 2007/0222533 A1* | 9/2007 | Lai ........................ | H05K 1/0248 333/4 |
| 2013/0199834 A1* | 8/2013 | De Geest ............... | H05K 1/024 174/266 |

* cited by examiner

*Primary Examiner* — Samuel S Outten
(74) *Attorney, Agent, or Firm* — Park, Vaughan, Fleming & Dowler LLP (57) ABSTRACT

One embodiment can provide a method and system for compensating for timing skew in a differential pair transmission line on a printed circuit board (PCB). During operation, the system obtains a PCB comprising one or more layers and at least a differential pair transmission line. The differential pair transmission line comprises first and second transmission lines, with a respective transmission line coupled to at least one via extending through the one or more layers of the PCB. The system determines a difference in length between first and second transmission lines and determines a stub length of the at least one via based on the determined difference in length between the first and second transmission lines, thereby compensating for the time skew in the differential pair transmission line.

8 Claims, 7 Drawing Sheets

ASYMMETRIC DIFFERENTIAL VIA STUBS FOR SKEW COMPENSATION

BACKGROUND

Field

This disclosure is generally related to fabrication of printed circuit boards (PCBs). More specifically, this disclosure is related to a system and method that compensates for timing skews on differential transmission lines.

Related Art

A differential pair transmission line can include two conductive paths of equal length, with signals on the two paths being equal in amplitude but opposite in polarity. On a high-density PCB, due to spatial constraint, a differential pair transmission line can experience multiple bends and turns along its path, resulting in possible timing skews between the true (P) and complementary (N) signals.

BRIEF DESCRIPTION OF THE FIGURES

In the figures, like reference numerals refer to the same figure elements.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the scope of the present disclosure is not limited to the embodiments shown, but is to be accorded the widest scope consistent with the principles and features disclosed herein.

The embodiments described herein provide a solution for compensating for timing skews for differential pair transmission lines. More specifically, the system compensates for the timing skew on a differential pair of transmission lines by introducing asymmetric via stubs for the differential pair. The path difference between the pair of transmission lines can be compensated for by manipulating the lengths of the via stubs. The length of a via stub can be controlled or adjusted by a number of techniques, such as a back-drilling technique and a sequential-lamination technique. In some embodiments, the timing skew of a differential pair transmission line can be compensated for by controlling the lengths of the via stubs and constructing top-hat structures on the transmission line.

One embodiment can provide a method and system for compensating for timing skew in a differential pair transmission line on a printed circuit board (PCB). During operation, the system obtains a PCB comprising one or more layers and at least a differential pair transmission line. The differential pair transmission line comprises first and second transmission lines, with a respective transmission line coupled to at least one via extending through the one or more layers of the PCB. The system determines a difference in length between first and second transmission lines and determines a stub length of the at least one via based on the determined difference in length between the first and second transmission lines, thereby compensating for the time skew in the differential pair transmission line.

In a variation on this embodiment, an inner surface of the at least one via is plated with metal, and controlling the stub length can include controlling a distance between a plane of the respective transmission line and a bottom edge of the plated metal.

In a further variation, the system can remove a portion of the plated metal on the inner surface of the at least one via based on the determined stub length.

In a further variation, removing the portion of the metal comprises applying a back-drilling technique to the at least one via.

In a further variation, the PCB comprises a plurality of layers, and the PCB is fabricated using a sequential-lamination process to ensure that the stub length of the at least one via in the fabricated PCB substantially equals the determined stub length.

In a variation on this embodiment, the system can determine a desired difference in stub length between a first via coupled to the first transmission line and a second via coupled to the second transmission line based at least on the determined difference in length between the first and second transmission lines. The system can further adjust a first stub length of the first via and a second stub length of the second via in such a way that the difference in stub length between the first and second vias substantially equals the desired difference.

In a variation on this embodiment, the at least one via is located at an end of the respective transmission line to facilitate the respective transmission line to couple to a PCB trace or device located at a different PCB layer.

In a variation on this embodiment, the at least one via is located on a path of the respective transmission line, and the at least one via does not couple to any other PCB trace or device.

In a variation on this embodiment, at least one transmission line comprises a top-hat structure configured to compensate for a portion of the timing skew in the differential pair.

In a variation on this embodiment, the stub length of the at least one via is determined based on both the determined difference in length between the first and second transmission lines and an additional factor contributing to the timing skew.

One embodiment can provide a printed circuit board (PCB). The PCB can include one or more layers, at least a differential pair transmission line, wherein the differential pair transmission line comprises first and second transmission lines, and one or more vias extending through the one or more layers of the PCB, wherein a respective transmission line of the differential pair is coupled to at least one via. A stub length of the at least one via is controlled based at least on a difference in length between the first and second transmission lines, thereby facilitating compensation for a timing skew in the differential pair transmission line.

Compared to single-ended signaling, differential signaling can provide a number of benefits, such as no return ground current, less EMI, reduced crosstalk, lower voltage, etc. Differential signaling requires differential pair transmission lines to carry electrical signals. However, timing skews between the two transmission lines of a differential pair can be problematic, especially for high-frequency applications. The intra-pair skew can cause unwanted resonances and additional channel loss, which results from the rejection of the incurred common-mode signal.

Figure 1:
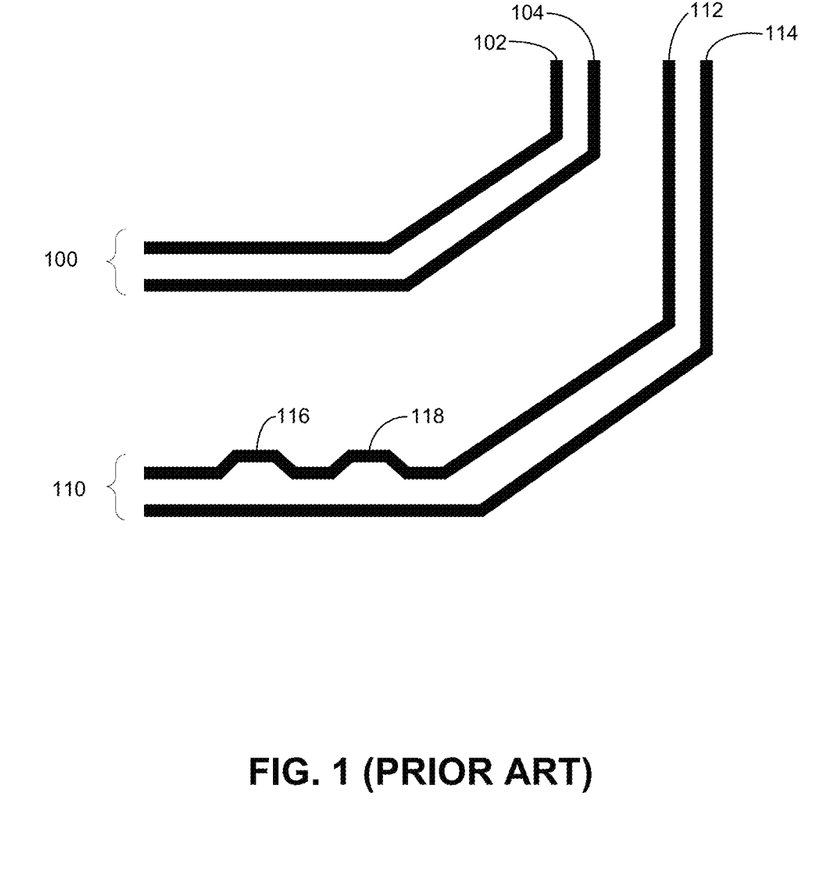
FIG. 1 illustrates an exemplary top-hat skew-compensation scheme, according to prior art.

Timing skew is the deviation of propagation delay from required reference timing. For a differential pair, the main source of skew is the length difference. Conductive traces on a complex PCB often need to bend or turn several times, thus resulting in a length difference between the two transmission lines of a differential pair. "Top-hat" structures have been used by many circuit designers as a simple mechanism for matching routing lengths. FIG. 1 shows an exemplary top-hat skew-compensation scheme, according to prior art. In FIG. 1, the partial view of two differential transmission pairs is shown, differential pair 100 and differential pair 110. Each differential pair includes two parallel transmission lines with a number of turns. More specifically, differential pair 100 includes transmission lines 102 and 104, and differential pair 110 includes transmission lines 112 and 114. As one can see from FIG. 1, due to the bend or turn of each transmission pair, the outer transmission line can be slightly longer than the inner transmission line. For example, transmission line 104 can be slightly longer than transmission line 102. Such a length difference can cause a timing skew (e.g., phase or group delay) between signals on transmission lines 102 and 104, which in turn can result in signal distortion in the time-domain response. To match the routing lengths in such a situation, top-hat structures (e.g., structures 116 and 118) can be added to the shorter transmission line. In the example shown in FIG. 1, inner transmission line 112 of differential pair 110 can include top-hat structures 116 and 118, which can add to the total length of inner transmission line 112 in such a way that the length of inner transmission line 112 matches the length of outer transmission line 114.

However, the skew-compensation ability of the top-hat structures can be limited, especially in a complex PCB where trace density is high. In a high-density PCB, long traces often have multiple (e.g., ten or more) bends, meaning that a large number of top-hat structures may be needed to compensate for the length difference resulting from the bends. In addition, the increased density also means that the PCB traces can be close to each other, making it difficult to implement the top-hat structures without adding crosstalk between adjacent transmission lines.

To compensate for the timing skew without causing crosstalk, the disclosed embodiments create or manipulate the lengths of the via stubs of the transmission lines. More specifically, by deliberately introducing asymmetric via stubs, one can reduce or eliminate the timing skew in a differential pair. In a multilayer PCB, vias are used to make electrical connections between layers and can carry signals or power between layers. A common form of vias uses plated through hole (PTH) technology. A PTH via can be formed by drilling a hole through the layers to be connected and then copper plating the inner surface of the hole. More particularly, a stub via (which is a common type of PTH via) can connect two layers (e.g., a top layer and an inner layer, or two inner layers) within the PCB, with one or more stub portions continuing from the inner layer to the top or bottom layer of the PCB. Vias are often located at ends of PCB traces to couple the PCB traces to PCB traces on another layer. Depending on the connection needed, a particular transmission line may or may not include a via. The remaining stub portion of a via can function as a resonance structure and cause propagation delay in the PCB trace coupled to the via, with the amount of delay being proportional to the length of the stub. Therefore, by controlling the length of a via stub, one can control the time delay of the corresponding transmission line.

Figure 2A:
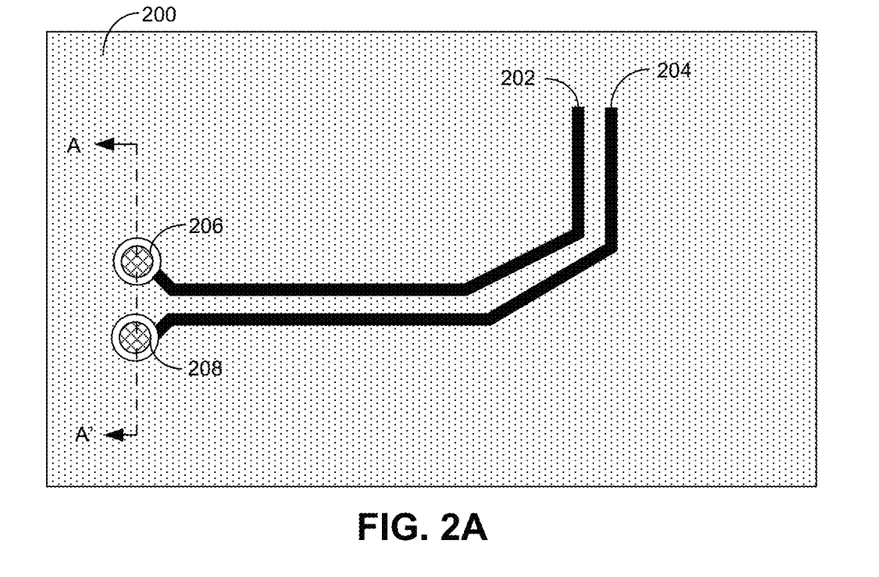
FIG. 2A illustrates the top view of an exemplary differential transmission pair, according to one embodiment.

FIG. 2A illustrates the top view of an exemplary differential transmission pair, according to one embodiment. In FIG. 2A, a differential pair transmission line that includes transmission lines 202 and 204 is positioned on a PCB 200. Note that transmission lines 202 and 204 can be located on a particular layer of a multilayer PCB, and the top view referred to is the view from the top of that particular layer. PCB layers above that particular layer are assumed to be transparent. Transmission line 202 couples to a via 206 and transmission line 204 couples to a via 208. In the example shown in FIG. 2A, vias 206 and 208 can be plated through holes used for coupling transmission lines 202 and 204 to ball grid array (BGA) pins of a processor or ASIC package. Vias 206 and 208 can also be used to couple transmission lines 202 and 204 to traces in a different layer of PCB 200. In the example shown in FIG. 2A, each transmission line has a number of counterclockwise turns, with transmission line 202 on the inside of transmission line 204. As a result, the length of transmission line 202 can be slightly shorter than the length of transmission line 204.

Figure 2B:
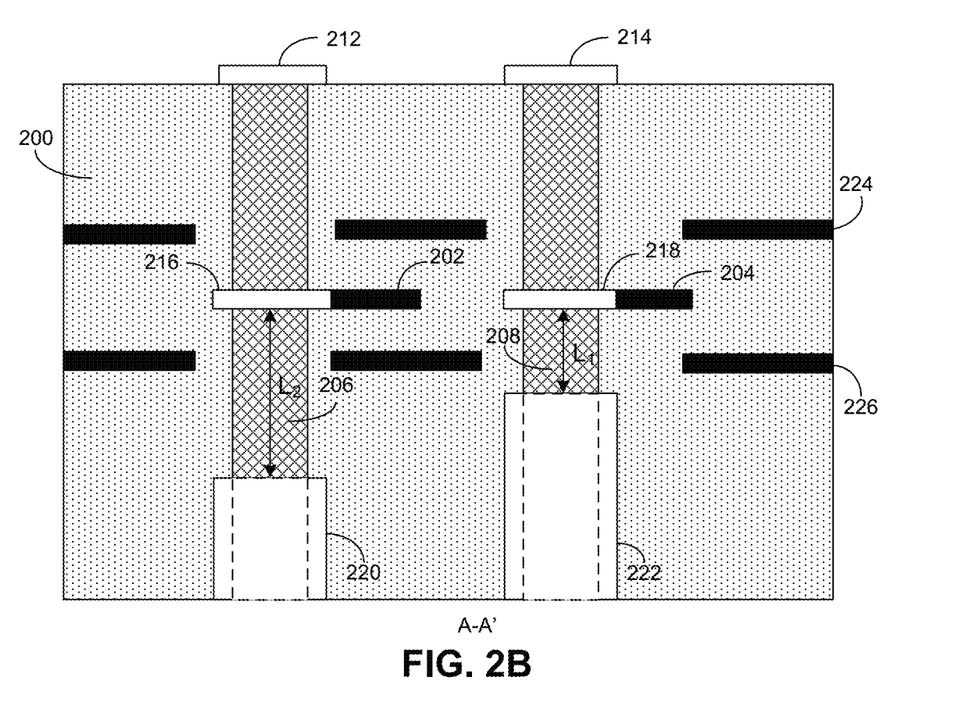
FIG. 2B illustrates the cross-sectional view of vias of differential pair 200 along cutting-plane A-A', according to one embodiment.

FIG. 2B illustrates the cross-sectional view of vias of the differential pair along cutting-plane A-A', according to one embodiment. PCB 200 can be a multilayer PCB that comprises one or more core layers and multiple metal layers, with adjacent metal layers being separated by a dielectric layer. For simplicity of illustration, the detailed layer structure is not shown in FIG. 2B, and only a portion of the layered structure of PCB 200 is shown in FIG. 2B. FIG. 2B shows that each of the vias (i.e., via 206 or 208) can be coupled to a signal pad positioned on the top surface of PCB 200. Such a signal pad (e.g., pad 212 or 214) can be used to couple the via to a corresponding BGA pin. Each via can also be coupled a transmission line embedded in PCB 200 through a signal pad. FIG. 2B shows that via 206 is coupled to embedded transmission line 202 through a pad 216, and via 208 is coupled to embedded transmission line 204 through a pad 218. FIG. 2B shows that a hole created by back-drilling partially removes the stub metal plating of each via (the removed metal is shown by the dashed lines). For example, back-drilled hole 220 partially removes stub metal plating of via 206, and back-drilled hole 222 partially removes stub metal plating of via 208. As a result of controlled back-drilling, the stubs of vias 206 and 208 can have predetermined lengths. In FIG. 2B, the stub length of via 208 is denoted $L_1$, and the stub length of via 206 is denoted $L_2$. More specifically, the stub length of each via is defined as a distance between the signal or routing layer (i.e., the layer where transmission lines reside) and the bottom edge of the remaining plated metal. FIG. 2B also shows a ground reference plane (e.g., reference plane 224 or 226) on either side of the signal plane where transmission lines 202 and 204 reside.

Each via stub (e.g., via stub 206 or 208) can function as a resonator, and a reflected signal can be sent back through the main routing paths (e.g., transmission lines 202 and 204) and added to the original signal. The combined signal can create a propagation delay, which is proportional to the length of the via stub. Consequently, by controlling the length difference between the via stubs, one can compensate for the timing skew caused by the length difference between the transmission lines (e.g., transmission lines 202 and 204) in a transmission pair. Compared to the traditional top-hat structures that are added onto the same plane of the transmission lines, the vertical via stubs do not occupy additional board space, thus saving space in the high-density signal routing area and reducing crosstalk. Moreover, the amount of compensation provided by each top-hat structure is limited and a large number of top-hat structures may be needed to compensate for a significant length difference. On the other hand, a relatively thick (e.g., a few hundred mils) PCB makes it possible to compensate for a relatively large timing skew by adjusting the length of the via stubs.

Figure 3A:
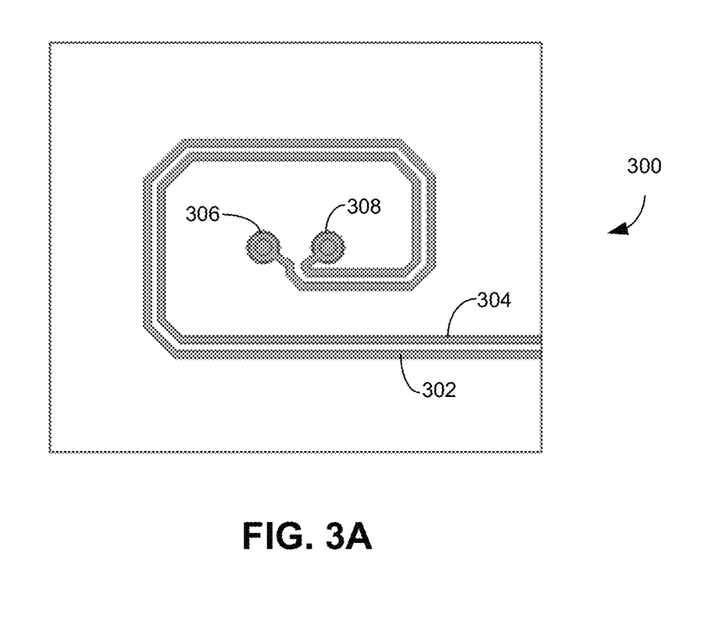
FIG. 3A illustrates an exemplary transmission pair on a PCB, according to one embodiment.

FIG. 3A illustrates an exemplary transmission pair on a PCB, according to one embodiment. In FIG. 3A, a transmission pair 300 can include transmission lines 302 and 304. Transmission line 302 can be coupled to a via 306 and transmission line 304 can be coupled to a via 308. Due to the large number (e.g., almost 10) of turns, there is a mismatch between the lengths of transmission lines 302 and 304. More specifically, inner transmission line 304 can be slightly shorter than outer transmission line 302. Once the PCB is fabricated, the length difference between transmission lines 302 and 304 can no longer be changed. However, the stub lengths of vias 306 and 308 can be adjusted using a post-fabrication process, such as back-drilling, thus effectively changing the delay on the transmission lines.

Figure 3B:
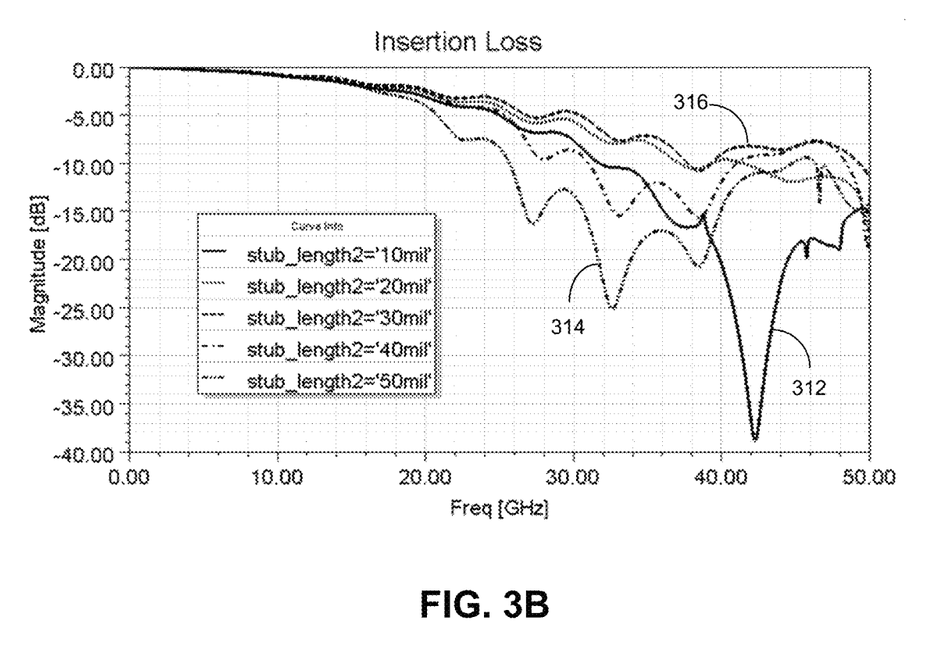
FIG. 3B illustrates the simulated insertion loss of transmission pair 300 for different stub lengths, according to one embodiment.

FIG. 3B illustrates the simulated insertion loss of transmission pair 300 for different stub lengths, according to one embodiment. In FIG. 3B, the stub length of via 306 (which is coupled to outer trace 302) is fixed at 10 mil (e.g., 0.01 inch), whereas the stub length of via 308 (which is coupled to inner trace 304) can vary between 10 mil and 50 mil. More specifically, FIG. 3B plots the frequency response of the insertion loss, which can be simulated using a high-frequency structure simulator (HFSS) tool. One can see from FIG. 3B that, when the stub length of via 308 is 10 mil (curve 312) or 50 mil (curve 314), significant resonant behavior of the insertion loss can be observed. On the other hand, the frequency response of the insertion loss can be more uniform, if the stub length of via 308 is about 30 mil (curve 316). The frequency response of the insertion loss is an indicator of the timing skew. A uniform or flat frequency response can indicate minimum or reduced timing skew in a differential pair. The simulation results demonstrated in FIG. 3B indicate that, when the stub lengths of the two vias are equal (i.e., 10 mil each), the timing skew is significant. As the difference in length between the two via stubs increases due to the increase of the stub length of via 308, which is coupled to shorter trace 304, the timing skew is reduced. When the difference in length reaches 20 mil, the timing skew is minimized. This indicates that the additional 20 mil in stub length of via 308 can compensate for the length difference between transmission lines 302 and 304. If the stub length of via 308 increases further, causing the stub length difference to be greater than 20 mil, the length difference between transmission lines 302 and 304 will be overcompensated for, and the timing skew increases accordingly.

In other words, in order to compensate for the length difference between transmission lines 302 and 304, one needs to deliberately make their via stubs asymmetric by ensuring that the via coupled to the shorter transmission line has a longer stub, whereas the via coupled to the longer transmission line has a shorter stub. Moreover, the length difference between the via stubs needs to be configured to provide appropriate skew compensation. In practice, once the length difference between the via stubs is determined, a post-fabrication process, such as back-drilling, can be applied to obtain the designed stub lengths.

Figure 4:
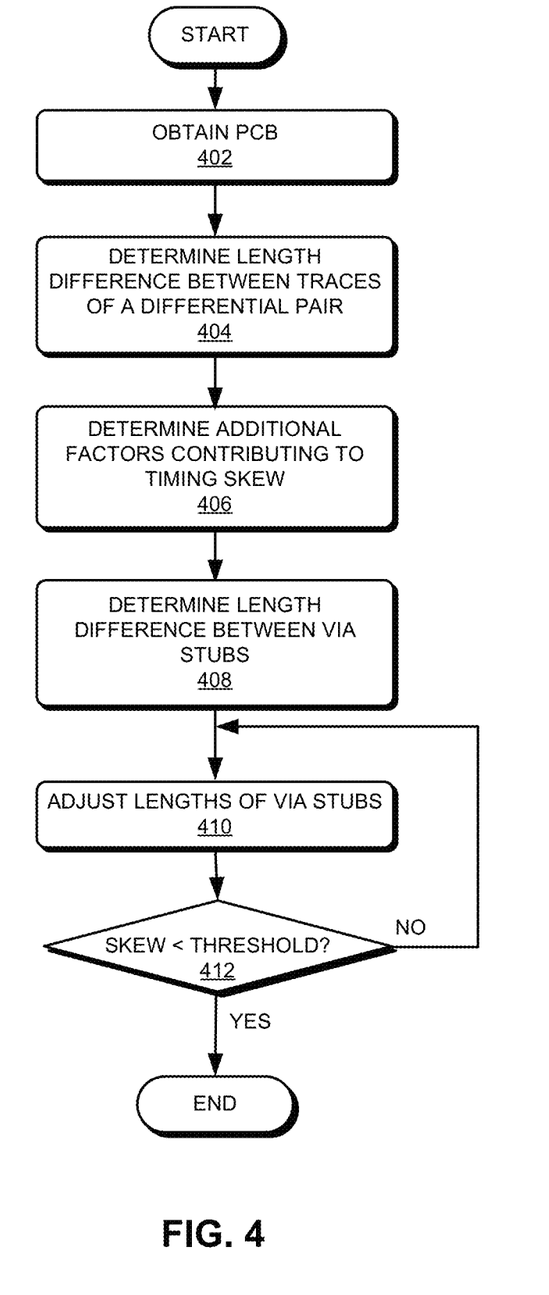
FIG. 4 presents a flowchart illustrating an exemplary process of compensating for the timing skew of a differential pair, according to one embodiment.

FIG. 4 presents a flowchart illustrating an exemplary process of compensating for the timing skew of a differential pair, according to one embodiment. During operation, a PCB having one or more differential pair transmission lines is obtained (operation 402). More specifically, the PCB can be designed and fabricated using any known standard method. The PCB can be a single layer PCB or a multilayer PCB. The scope of the disclosure is not limited by the structure or fabrication means of the PCB. A differential pair transmission line can include two PCB traces substantially running in parallel, with each PCB trace coupled to a via through the PCB. The PCB traces can be on the top layer or a middle layer of the PCB, and the vias allow the PCB traces to couple to signal lines or devices located at different PCB layers.

A length difference between the two PCB traces can be determined (operation 404). Note that the length difference can originate from the tuning and bending of the PCB traces, and the length difference can cause timing skew of the differential pair. Additional factors that can contribute to the timing skew can also be determined (operation 406). Such factors can include variations in trace width and the PCB material being inhomogeneous. Subsequently, the length difference between the via stubs of the two transmission lines that is appropriate for compensating for the timing skew can be determined based on the length difference and the additional factors that can contribute to the timing skew (operation 408). Various mechanisms can be used to determine the length difference between the via stubs. In some embodiments, one can run an HFSS simulation to determine the optimum value of the difference in the via stub lengths. For example, one can run the HFSS simulation by fixing one stub length and varying the length of the other via stub in order to find an optimum length-difference value that creates minimum timing skew. Alternatively, one can measure the current timing skew of the differential pair and determine the amount of adjustment needed for the via stub lengths based on the current timing skew. As previously discussed, too small or too big a stub-length difference can under- or overcompensate for the timing skew. In certain scenarios, the length difference between the PCB traces may be the main factor contributing to the timing skew, and other factors can be ignored.

Subsequently, a post-fabrication process can be applied to adjust lengths of the via stubs of the transmission lines such that the timing skews of the differential pair can be substantially compensated for (operation 410). If the system determines the stub-length difference based on simulation, the post-fabrication process can be used to create the desired stub-length difference by controlling the stub length of each via. Note that it is impractical to reduce the stub length of a particular via to zero. When applying the post-fabrication process, one can first adjust the stub length of a particular via to a predetermined non-zero value, and then adjust the stub length of the other via such that the stub-length difference can match the desired value for compensating for the timing skew.

Various post-fabrication processes can be used to achieve the desired stub lengths. In some embodiments, back-drilling can be used to achieve the desired stub length. More specifically, each via can be created by drilling a through hole at a desired location and subsequently plating the entire inner surface of the through hole. Back-drilling can remove a portion of the plated metal on the inner surface of the through hole. By controlling the depth of the back-drilling, one can achieve the desired length of the via stub (i.e., the distance between the location where the signal trace couples to the via and the edge of the plated metal on the inner surface of the via).

Other mechanisms can also be used to control the via stub lengths. In some embodiments, a sequential-lamination process can be used to produce a multilayer PCB. In such a scenario, depending on the desired stub length, one can choose to plate or not plate the via section in each PCB layer. When the multiple PCB layers are merged or laminated, the total stub length can be the desired stub length.

The system can then measure the timing skew of the transmission pair to determine if the timing skew is below a predetermined threshold (operation 412). Depending on the application (e.g., the operating frequency), the threshold can be set to different values. For high-frequency PCB (e.g., 40 GHz or above), the threshold value can be much smaller (e.g., less than a few picoseconds). If the measured timing skew is above the predetermined threshold, one can re-adjust the stub lengths using the post-fabrication process (operation 410). Note that, in order to allow for the re-adjustment, the initial stub-length adjustment process typically starts with adjusting the length of the shorter via stub to a predetermined non-zero value (e.g., a few mils) followed by adjusting the length of the longer via stub.

To increase the amount of timing skews that can be compensated for, in some embodiments, in addition to existing vias at the ends of transmission lines, additional vias can be created on the path of the transmission line, and by adjusting the stub lengths of these additional vias, timing skew of a greater range between the two transmission lines can be compensated for.

Figure 5A:
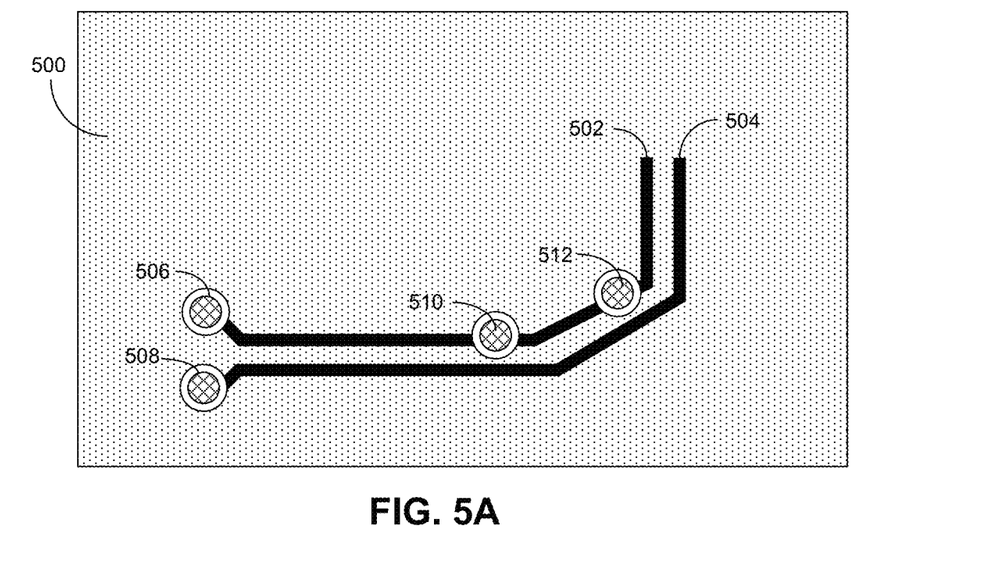
FIG. 5A illustrates the top view of an exemplary transmission pair with additional skew compensation, according to one embodiment.

FIG. 5A illustrates the top view of an exemplary transmission pair with additional skew compensation, according to one embodiment. In FIG. 5A, a differential pair, which includes transmission lines 502 and 504, is located on PCB 500. Similar to the examples shown in FIG. 2A and FIG. 3A, the top view of transmission lines 502 and 504 is viewed from the top of the layer where transmission lines 502 and 504 are situated. Transmission lines 502 and 504 can be located on any layer of a multilayer PCB.

Each transmission line is coupled to a via at its end to allow the transmission line to establish connection to signal traces or devices on other PCB layers. For example, transmission line 502 is coupled to via 506, and transmission line 504 is coupled to via 508. As discussed previously, the stub lengths of vias 506 and 508 can be controlled, more particularly a desired difference in stub lengths can be created, to compensate for the timing skew on the differential pair. However, the maximum value of the stub-length difference is limited by the thickness of the PCB, which can be between 100 and 150 mils. In situations where the length difference between the transmission lines is significantly larger than the PCB thickness (e.g., more than twice as large), merely manipulating the stub lengths of the existing vias can be insufficient. To provide a greater range for skew compensation, in some embodiments, additional vias can be created on the path of the shorter or inner transmission line. In the example shown in FIG. 5A, additional vias 510 and 512 are created in the path of transmission line 502. These additional vias can create further delay in transmission line 502, thus increasing the skew-compensation range.

Figure 5B:
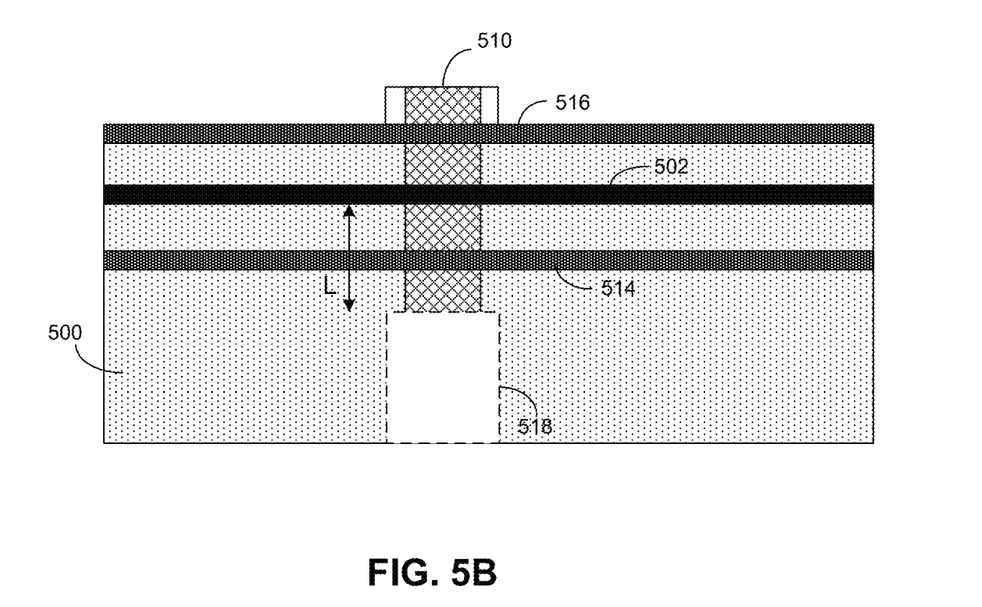
FIG. 5B illustrates the cross-sectional view of an additional via, according to one embodiment.

FIG. 5B illustrates the cross-sectional view of an additional via, according to one embodiment. In FIG. 5B, the cutting plane runs through the center of additional via 510, along the path of transmission line 502. FIG. 5B also shows that transmission line 502 is situated on a middle layer of PCB 500, with ground reference planes 514 and 516 on either side. The stub length of additional via 510, L, can be determined by the depth of back-drilled hole 518.

In the example shown in FIGS. 5A-5B, two additional vias are created on inner transmission path 502. In practice, depending on the length and the number of turns of transmission lines 502 and 504, fewer or more additional vias can be created. In addition to creating additional vias on the path of the shorter transmission line, it is also possible to create additional vias on the path of the outer or longer transmission line (e.g., transmission line 504), thus providing greater flexibility in compensating for timing skew.

Figure 6:
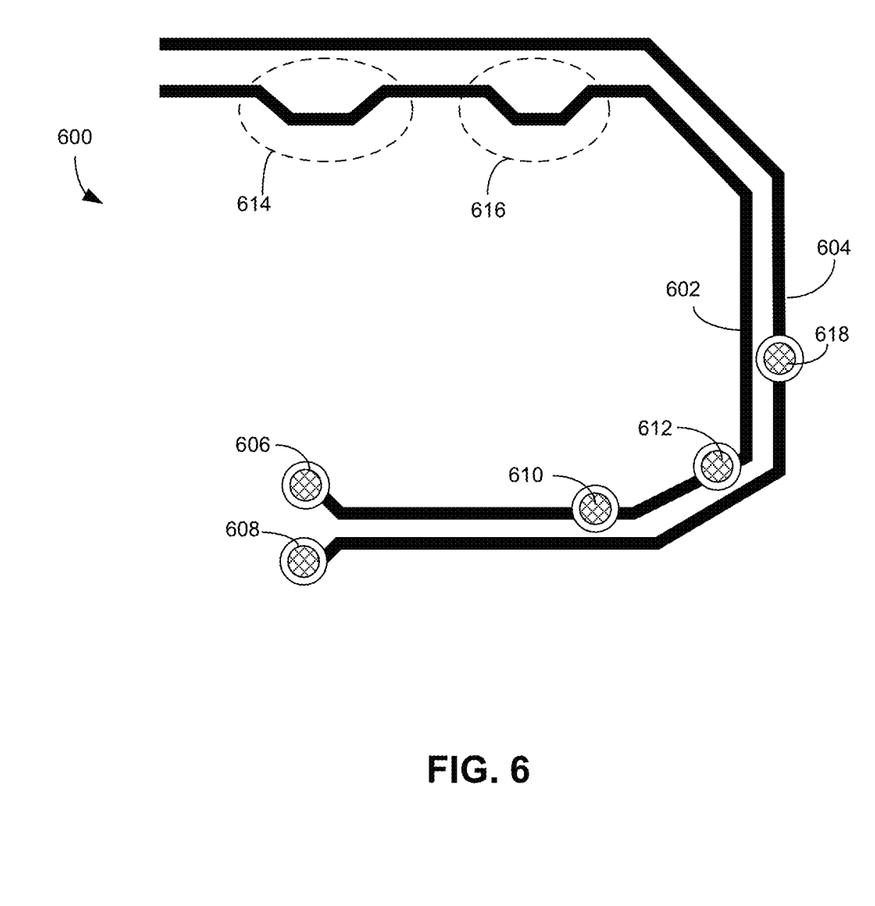
FIG. 6 illustrates an exemplary timing-skew compensation scheme, according to one embodiment.

In addition to the additional vias, other means can also be incorporated to further expand the range of the skew compensation. In some embodiments, other than the signal via at the end of the transmission line and additional vias along the path of the transmission line, the transmission line can also include one or more top-hat structures. FIG. 6 illustrates an exemplary timing-skew compensation scheme, according to one embodiment. In FIG. 6, a differential pair 600 includes transmission lines 602 and 604, which are coupled to signal vias 606 and 608, respectively. Due to a number of turns, inner transmission line 602 has a shorter length than outer transmission line 604, leading to a significant timing skew of differential pair 600. To compensate for the timing skew, the stub lengths of signal vias 606 and 608 can be adjusted such that the stub length of signal via 606 is longer than that of signal via 608. Note that vias 606 and 608 are referred to as signal vias because they allow transmission lines 602 and 604 to be connected to signal paths in other PCB layers.

Due to the large skew, adjusting the signal vias alone may not be sufficient. To further compensate for the skew, inner transmission line 602 can include one or more additional vias (e.g., additional vias 610 and 612). Unlike signal vias 606 and 608, additional vias 610 and 612 do not connect to signal paths in other PCB layers. Moreover, inner transmission line 602 can include one or more top-hat structures (e.g., top-hat structures 614 and 616). The top-hat structures are defined during the PCB layout, before the fabrication of the PCB. However, adjustment of the via stubs (including stubs of signal vias 606 and 608, and additional vias 610 and 612) can be done post fabrication. For example, a back-drilling technique can be applied to engineer the stub length of each individual via in order to compensate for the timing skew. To increase the accuracy of the skew compensation, multiple rounds of back-drilling may be needed. In the example shown in FIG. 6, an additional via 618 is added to longer transmission line 604, thus providing further flexibility for timing skew compensation.

Figure 7:
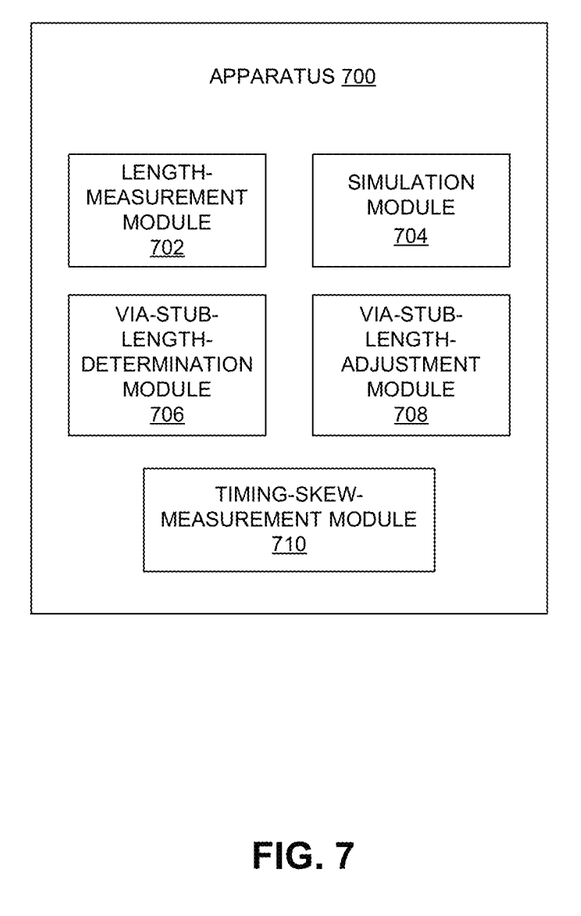
FIG. 7 illustrates an exemplary apparatus that facilitates operations of timing-skew compensation, according to one embodiment.

FIG. 7 illustrates an exemplary apparatus that facilitates operations of timing-skew compensation, according to one embodiment. Apparatus 700 can include a length-measurement module 702 for measuring the length of each transmission line in a differential pair. The measurement can be done after the fabrication of the PCB, and length-measurement module 702 can measure the physical length of the PCB trace. Alternatively, length-measurement module 702 can obtain the length of each transmission line from the PCB design software.

Apparatus 700 can include a simulation module 704 and a via-stub-length-determination module 706. In some embodiments, simulation module 704 can run an HFSS simulation to estimate the amount of timing skew of the differential pair. Via-stub-length-determination module 706 can determine the stub-length difference for signal vias of the transmission lines and, when applicable, lengths of additional vias. In some embodiments, via-stub-length-determination module 706 can make such determinations based on the output of length-measurement module 702. If there are other factors contributing to the timing skew, via-stub-length-determination module 706 may determine the lengths of the various stubs based on the simulation outcome of simulation module 704.

Apparatus 700 can include a via-stub-length adjustment module 708. Before the length adjustments, the entire inner surface of each via (including the signal vias and the additional vias) are plated with metal. Via-stub-length adjustment module 708 can partially remove the metal on the inner surface of the vias. More specifically, the stub length of each via can be adjusted individually using a back-drilling technique or a sequential-lamination process where metal plating on the inner surface of the via on each PCB layer can be performed independently.

Apparatus 700 can include a timing-skew-measurement module 710 for measuring the actual timing-skew of the differential pair. The measurement result can be used to determine whether further adjustment of the stub length of the vias is needed.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, the methods and processes described above can be included in hardware modules or apparatus. The hardware modules or apparatus can include, but are not limited to, application-specific integrated circuit (ASIC) chips, field-programmable gate arrays (FPGAs), dedicated or shared processors that execute a particular software module or a piece of code at a particular time, and other programmable-logic devices now known or later developed. When the hardware modules or apparatus are activated, they perform the methods and processes included within them.

The foregoing descriptions of embodiments have been presented for purposes of illustration and description only. They are not intended to be exhaustive or to limit the scope of this disclosure to the forms disclosed. Accordingly, many modifications and variations will be apparent to practitioners skilled in the art.

What is claimed is:

1. A printed circuit board (PCB), comprising:
   one or more layers;
   at least a differential pair transmission line, wherein the differential pair transmission line comprises first and second transmission lines of different lengths; and
   one or more vias extending through the one or more layers of the PCB, wherein ends of first and second transmission lines of the differential pair are coupled to a first via and a second via, respectively, and wherein the first transmission line is coupled to an additional via on a path of the first transmission line;
   wherein the vias have different stub lengths, wherein a difference in stub length between the first via and the second via provides a compensation for a timing skew caused by the different lengths between the first and second transmission lines of the differential pair transmission line.

2. The PCB of claim 1, wherein an inner surface of a respective via is plated with metal, and wherein the stub length of the respective via is controlled by adjusting a distance between a plane of the respective transmission line and a bottom edge of the plated metal.

3. The PCB of claim 2, wherein the respective via further comprises a back-drilled hole that removes a portion of the plated metal.

4. The PCB of claim 2, wherein the PCB comprises a plurality of layers, and wherein the PCB is fabricated using a sequential-lamination process to control the stub length of the respective via in the fabricated PCB.

5. The PCB of claim 1, wherein the first or second via facilitates a corresponding transmission line to couple to a PCB trace or device located at a different PCB layer.

6. The PCB of claim 1, wherein the additional via does not couple to any other PCB trace or device.

7. The PCB of claim 1, wherein at least one transmission line comprises a top-hat structure configured to compensate for a portion of the timing skew in the differential pair.

8. The PCB of claim 1, wherein the difference in stub length further provides a compensation for a timing skew caused by an additional factor.

* * * * *